United States Patent
Kim

(10) Patent No.: US 7,633,761 B2
(45) Date of Patent: Dec. 15, 2009

(54) FLEXIBLE CIRCUIT FILM AND DISPLAY PANEL ASSEMBLY HAVING THE SAME

(75) Inventor: Ock-Jin Kim, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/637,252

(22) Filed: Dec. 11, 2006

(65) Prior Publication Data

US 2007/0134473 A1    Jun. 14, 2007

(30) Foreign Application Priority Data

Dec. 12, 2005    (KR) ..................... 10-2005-0121641

(51) Int. Cl.
*H05K 1/00* (2006.01)
(52) U.S. Cl. ........................ 361/749; 174/254
(58) Field of Classification Search ................. 361/749; 345/206, 87; 174/254; 29/848
See application file for complete search history.

(56) References Cited

U.S. PATENT DOCUMENTS

| | | | | |
|---|---|---|---|---|
| 5,233,754 A | * | 8/1993 | Matsunaga et al. ............ 29/848 |
| 5,670,994 A | * | 9/1997 | Kawaguchi et al. ......... 345/206 |
| 7,518,248 B2 | * | 4/2009 | Li et al. ....................... 257/774 |
| 2003/0094305 A1 | * | 5/2003 | Ueda ........................... 174/254 |
| 2003/0201989 A1 | * | 10/2003 | Kim et al. .................... 345/206 |
| 2005/0078459 A1 | * | 4/2005 | Yeon ........................... 361/749 |
| 2005/0190175 A1 | * | 9/2005 | Kim et al. .................... 345/204 |

* cited by examiner

*Primary Examiner*—Dean A. Reichard
*Assistant Examiner*—Andargie M Aychillhum
(74) *Attorney, Agent, or Firm*—Innovation Counsel LLP

(57) ABSTRACT

A flexible circuit film whose signal lines are resistant to cracking even upon bending is presented. The flexible circuit film includes a base substrate, a signal transmission line and a crack-preventing portion. The signal transmission line is formed on a first surface of the base substrate. The crack-preventing portion is formed on a portion of a second surface of the base substrate that is opposite to the first surface to prevent cracking of the signal transmission line. The crack-preventing portion is formed on the part of the flexible circuit film that is bent by a large angle when the flexible circuit film is assembled with another component.

22 Claims, 8 Drawing Sheets

FLEXIBLE CIRCUIT FILM AND DISPLAY PANEL ASSEMBLY HAVING THE SAME

CROSS-REFERENCE TO RELATED APPLICATIONS

This application relies for priority upon Korean Patent Application No. 2005-121641 filed on Dec. 12, 2005, the content of which is herein incorporated by reference in its entirety.

BACKGROUND OF THE INVENTION

1. Field of the Invention

The present invention relates to a flexible circuit film and a display panel assembly having the flexible circuit film. More particularly, the present invention relates to a flexible circuit film with reduced crack formation in a signal transmission line and a display panel assembly having the flexible circuit film.

2. Description of the Related Art

Generally, a liquid crystal display (LCD) device corresponding to a flat panel display device displays an image using electrical and optical characteristics of liquid crystals. The LCD device has advantageous characteristics such as thinness, light weight, low driving voltage, low power consumption, etc. For these advantages, LCD devices are widely used as the display panel in various applications.

The LCD device includes a display panel assembly and a backlight assembly that provides light to the display panel assembly. The display panel assembly displays an image by using the optical transmissivity of liquid crystals.

The display panel assembly includes an array substrate having a thin film transistor, a color filter substrate having a color filter, a liquid crystal layer disposed between the array substrate and the color filter substrate, a printed circuit board (PCB) generating a control signal for driving the thin film transistor, and a flexible circuit film electrically connecting the array substrate to the PCB so as to transmit the control signal to the array substrate. The flexible circuit film includes a signal transmission line transmitting the control signal from the PCB to the array substrate.

During assembly, the flexible circuit film is wrapped around the edge of a substrate such that the PCB that is attached to the flexible circuit film is disposed under the display panel assembly. When the flexible circuit film is bent this way, a crack sometimes forms in the signal transmission line. Since the signal transmission line of the flexible circuit film is bent most extremely near the end portion of the array substrate or at the end portion of the PCB, a crack is most likely to form near the end portion of the array substrate or at the end portion of the PCB.

A cracked signal transmission line does not transmit the control signal well. Thus, crack formation in the signal transmission line of the flexible circuit film deteriorates the display quality of the LCD device.

SUMMARY OF THE INVENTION

The present invention obviates the above problems and provides a flexible circuit film capable of reinforcing parts of the flexible circuit film that is most vulnerable to cracking of a signal transmission line.

The present invention also provides a display panel assembly having the above-mentioned flexible circuit film.

In one aspect of the present invention, a flexible circuit film includes a base substrate, a signal transmission line and a crack-preventing portion. The signal transmission line is formed on a first surface of the base substrate. The crack-preventing portion is formed on a portion of a second surface of the base substrate that is opposite to the first surface to prevent cracking of the signal transmission line.

In another aspect, the present invention is a display panel assembly that includes a display panel, a printed circuit board and a flexible circuit film. The display panel displays an image. The printed circuit board is configured to generate a control signal that displays the image. The flexible circuit film includes a base substrate, a signal transmission line and a crack-preventing portion. The signal transmission line is formed on the base substrate to electrically connect the printed circuit board and the display panel to each other. The crack-preventing portion is formed on a portion of the base substrate that is bent to prevent cracking of the signal transmission line.

BRIEF DESCRIPTION OF THE DRAWINGS

The above and other features and advantage points of the present invention will become more apparent by describing in detailed example embodiments thereof with reference to the accompanying drawings, in which.

DESCRIPTION OF THE EMBODIMENTS

Figure 1:
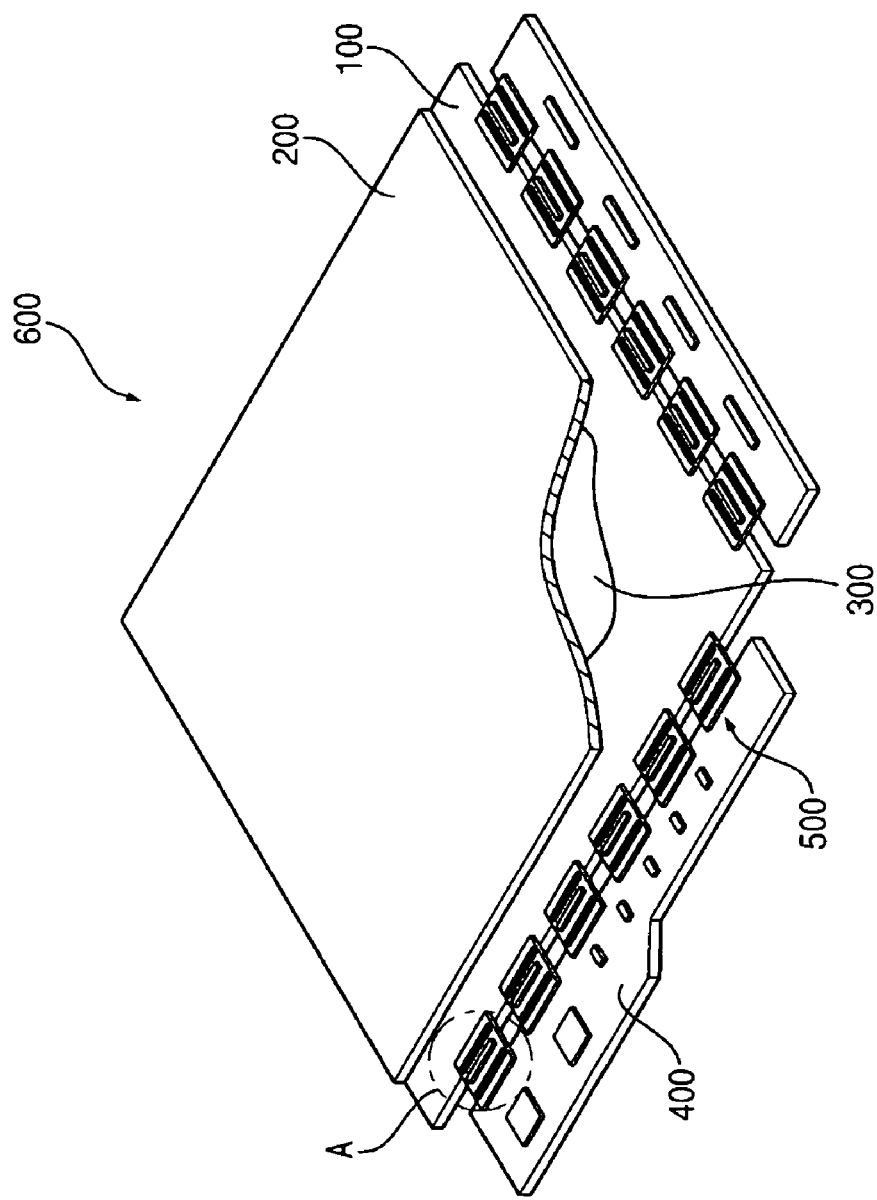
FIG. 1 is a perspective view illustrating a display panel assembly according to a first embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Embodiment 1

Display Panel Assembly

FIG. 1 is a perspective view illustrating a display panel assembly according to a first example embodiment of the present invention.

Referring to FIG. 1, a display panel assembly 600 includes a first substrate 100, a second substrate 200, a liquid crystal layer 300, a printed circuit board (PCB) 400 and a flexible circuit film 500. The display panel assembly 600 displays an image using light.

The first substrate 100 includes a plurality of pixel electrodes arranged in a matrix form, a plurality of thin film transistors (TFTs) applying a driving voltage to each pixel electrode, and a plurality of signal lines providing a driving signal to each TFT.

A transparent conductive material such as indium tin oxide (ITO) film, indium zinc oxide (IZO) film, amorphous indium tin oxide (a-ITO) film, etc. is deposited and patterned through photolithography process to form the pixel electrodes.

The second substrate 200 is disposed in a plane that is substantially parallel to that of the first substrate 100. The second substrate 200 includes a common electrode that is formed on an entire surface of the first substrate 200 and is transparent and conductive, and a plurality of color filters that overlap the pixel electrodes. The color filters include, for example, a red color filter, a green color filter and a blue color filter.

The liquid crystal layer 300 is interposed between the first and second substrates 100 and 200. An electric field is generated between the pixel electrodes and the common electrode to orient the liquid crystal molecules of the liquid crystal layer 300 in a desired manner. The liquid crystal layer 300 controls the optical transmission of light passing through the color filters to display the desired image.

The PCB 400 includes a driving circuit processing an image signal. The driving circuit converts an image signal from another component into a control signal for displaying an image. As mentioned above, the PCB is disposed under the first substrate 100 when the flexible circuit film 500 is bent to wrap around the first substrate 100. The PCB includes a data PCB and a gate PCB. The gate PCB may be omitted when signal lines are formed on the first substrate 100 and the flexible circuit film 500.

The flexible circuit film 500 electrically connects the PCB 400 to the first substrate 100, allowing the control signal generated by the PCB 400 to reach the first substrate 100. The flexible circuit film 500 may further include a driver chip that converts the control signal into a driving signal for driving the TFT. The flexible circuit film 500 may include, for example, the tape carrier package (TCP) or the chip on film (COF). Alternatively, the driver chip may be disposed on the first substrate 100 instead of being disposed on the flexible circuit film 500.

Hereinafter, the flexible circuit film 500 will be described in detail with reference to the accompanying drawings.

Figure 2:
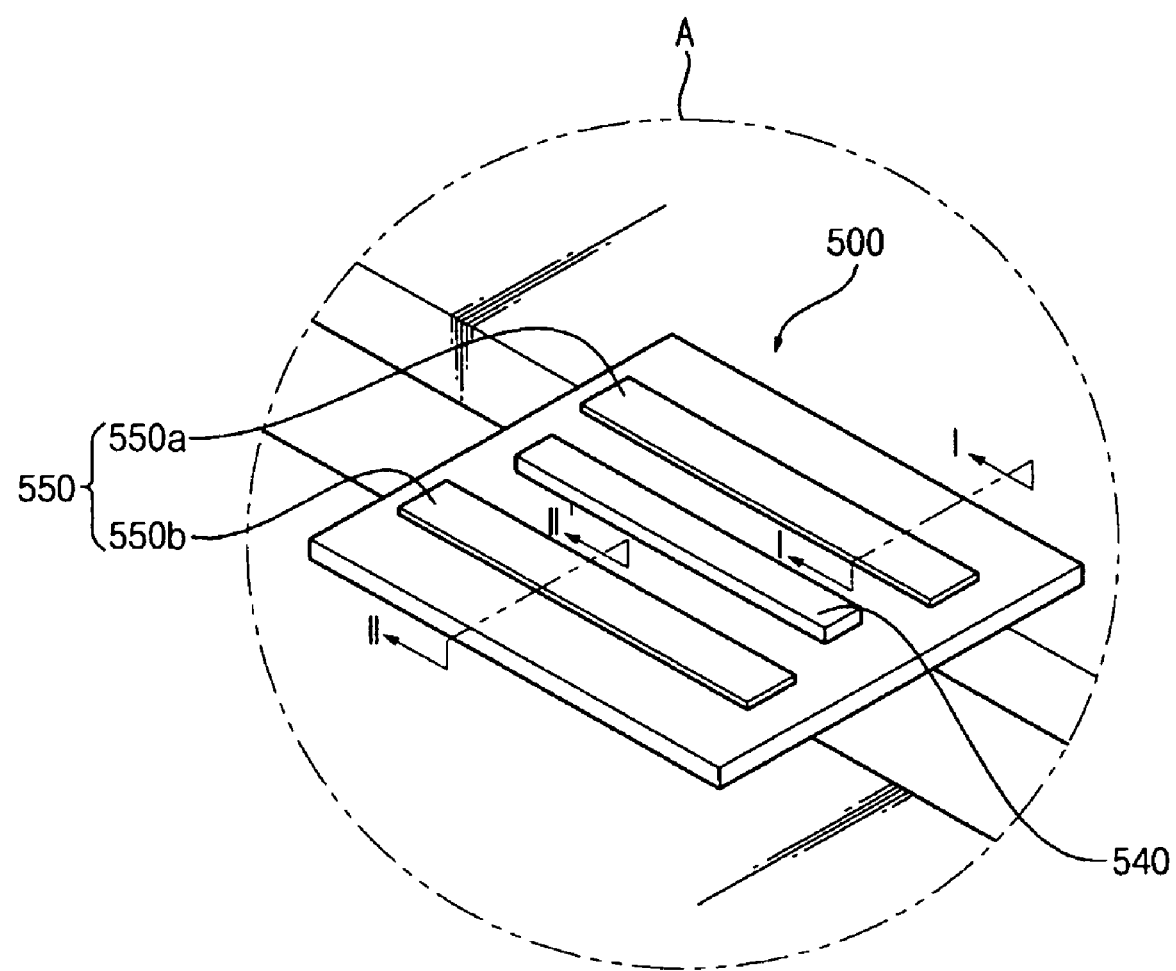
FIG. 2 is an enlarged view of the portion 'A' in FIG. 1.
Figure 3:
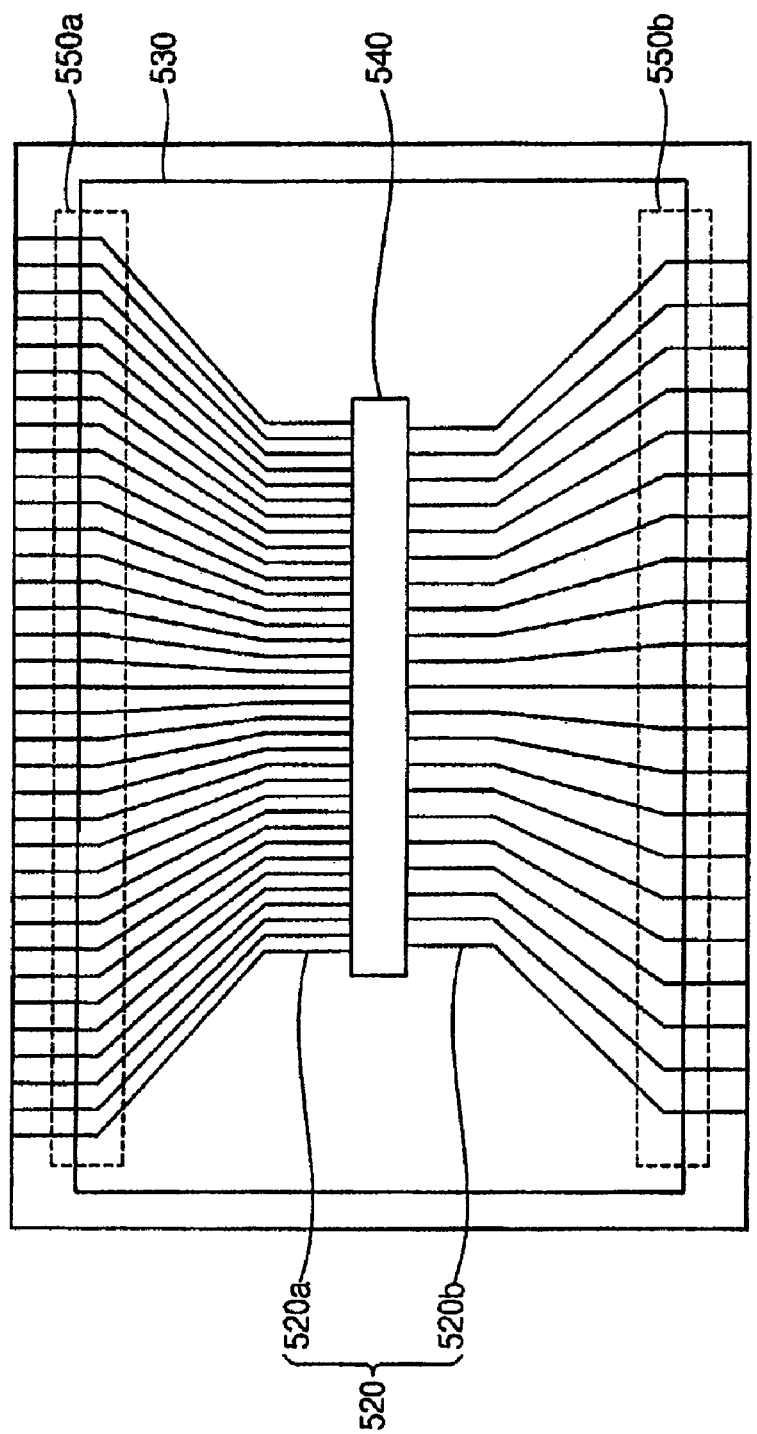
FIG. 3 is a plan view illustrating the flexible circuit film in FIG. 2.
Figure 4:
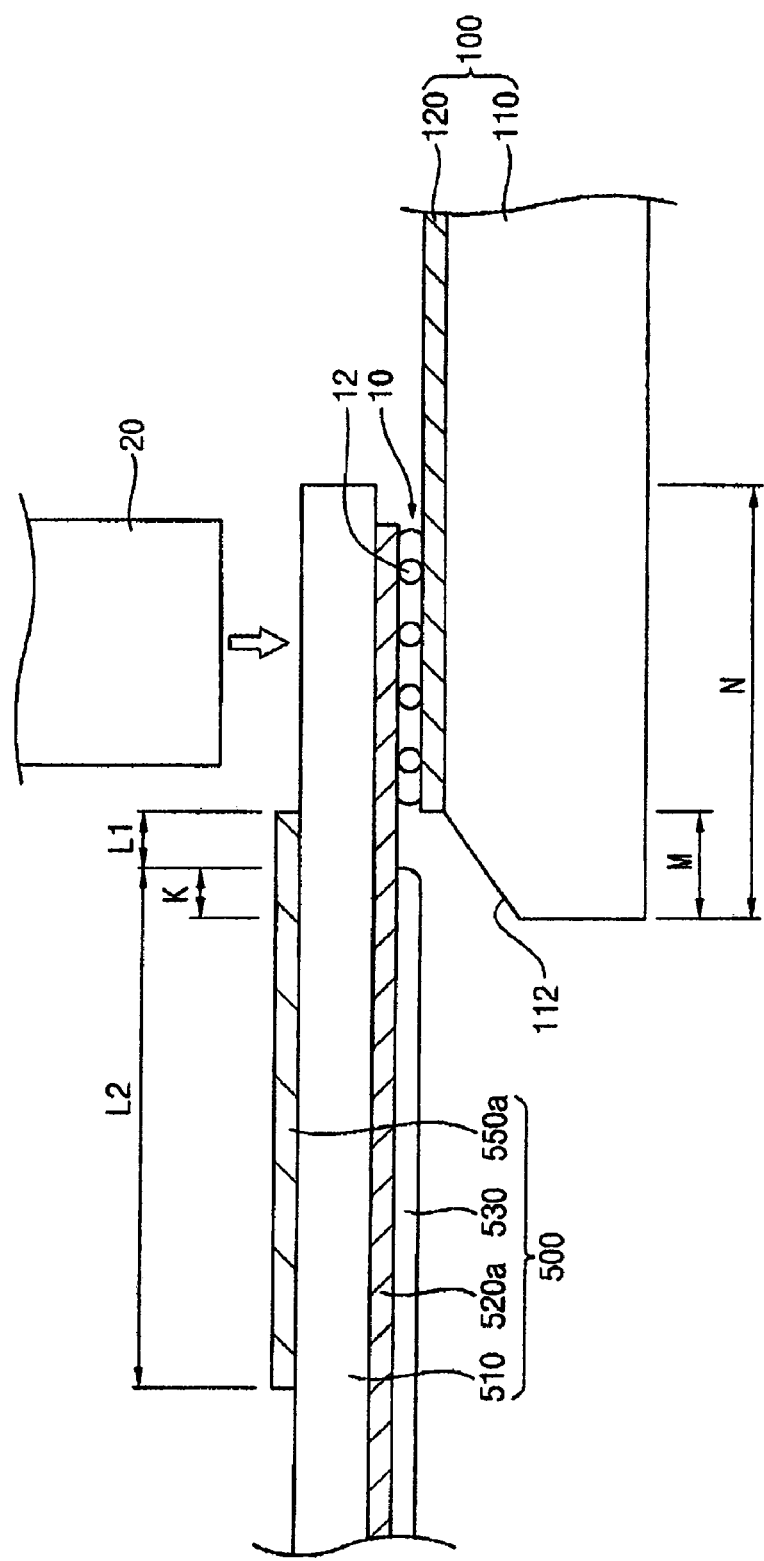
FIG. 4 is a cross-sectional view taken along the line I-I' in FIG. 2.
Figure 5:
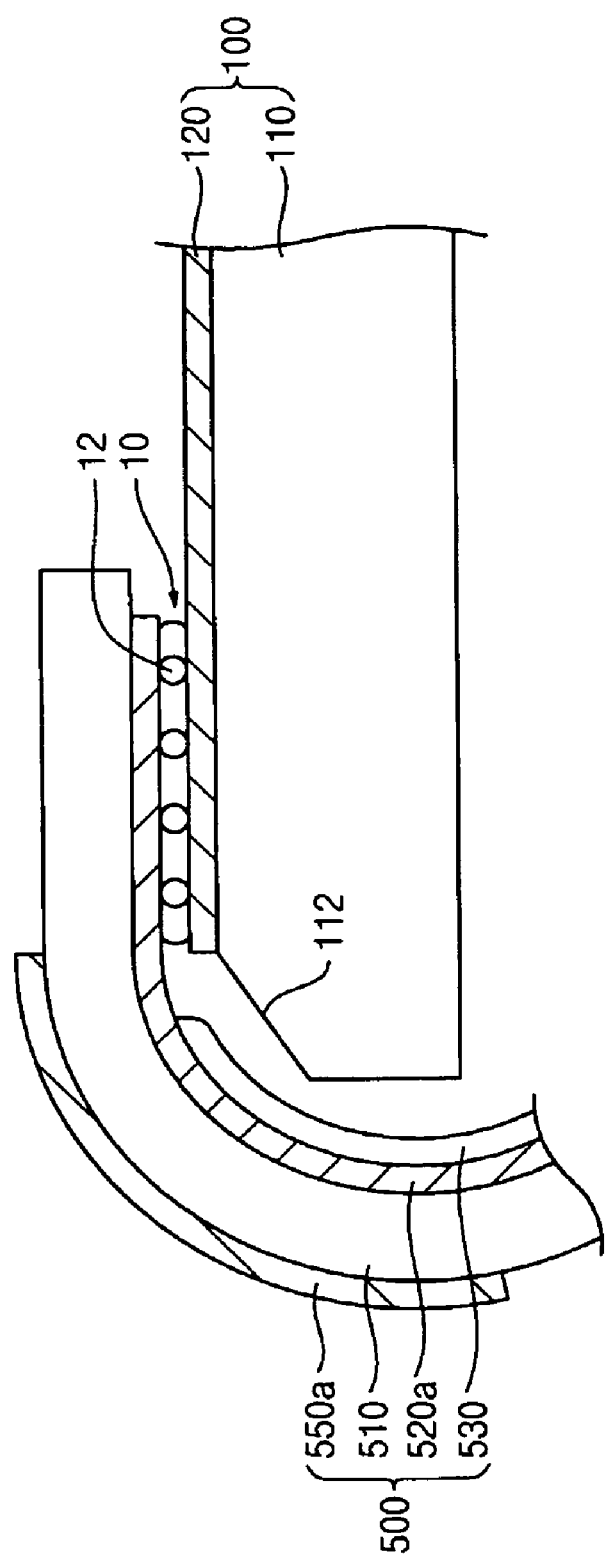
FIG. 5 is a cross-sectional view illustrating bending of the flexible circuit film of FIG. 4.
Figure 6:
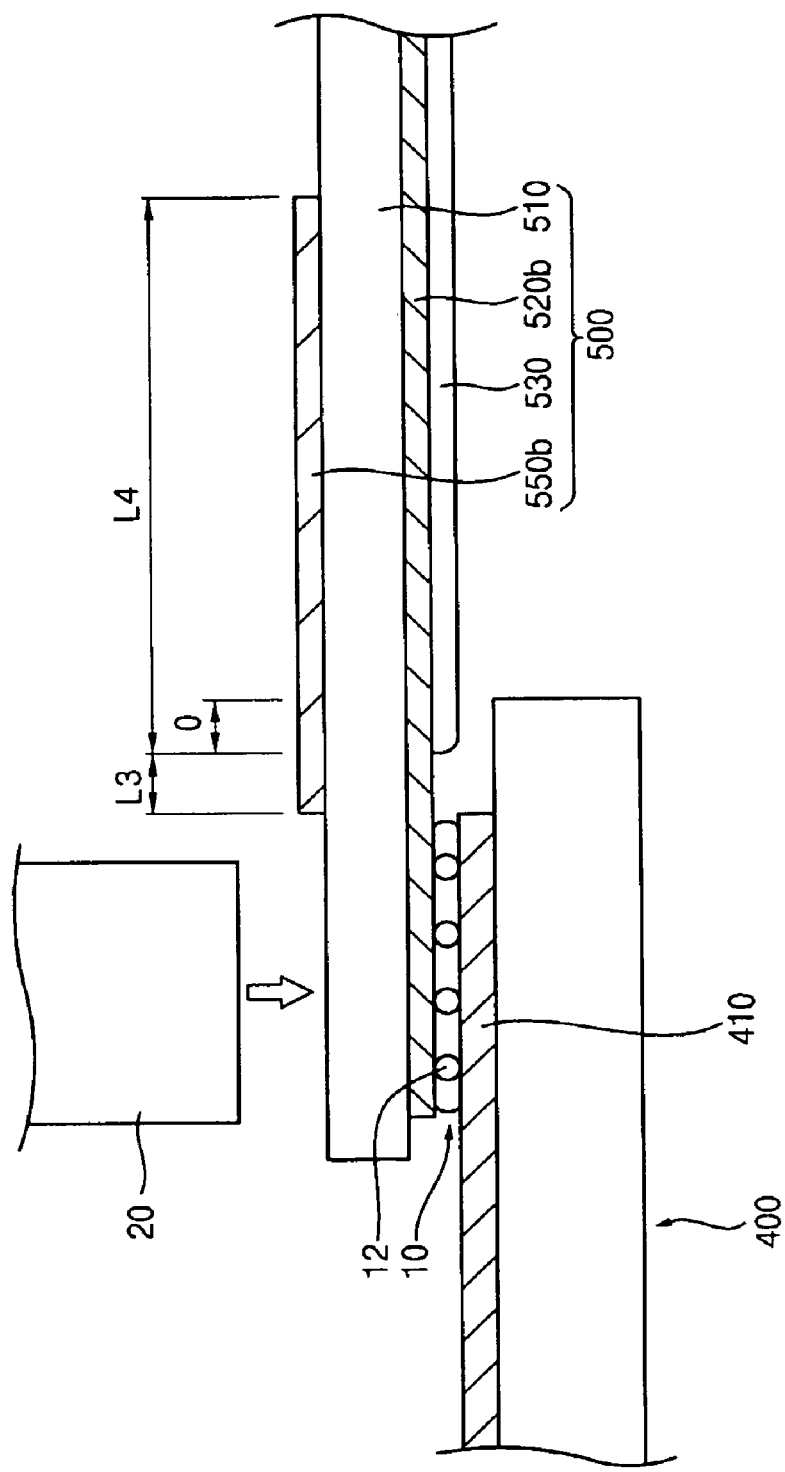
FIG. 6 is a cross-sectional view taken along the line II-II' in FIG. 2.

FIG. 2 is an enlarged view of the portion "A" in FIG. 1. FIG. 3 is a plan view illustrating the flexible circuit film in FIG. 2. FIG. 4 is a cross-sectional view taken along the line I-I' in FIG. 2. FIG. 5 is a cross-sectional view illustrating the bending of the flexible circuit film of FIG. 4. FIG. 6 is a cross-sectional view taken along the line II-II' in FIG. 2.

Referring to FIGS. 2 to 6, the flexible circuit film 500 according to the present invention includes a base substrate 510, a signal transmission line 520, a protective layer 530, a driver chip 540 and a crack-preventing portion 550.

The base substrate 510 may be formed, for example, in the shape of a plate. The base substrate 510 may contain a ductile synthetic resin such as polyimide (PI). The thickness of the base substrate 510 is in a range of, for example, about 20 mm to about 30 mm and is preferably about 25 mm.

The signal transmission line 520 is formed on a first surface of the base substrate 510 to electrically connect the PCB 400 to the first substrate 100. Particularly, the signal transmission line 520 is electrically connected to an output terminal 410 of the PCB 400 and electrically connected to a signal line 120 of the first substrate 500. A plurality of signal transmission lines 520 may be formed on the first surface of the base substrate 510 in a row. The signal transmission line 520 may contain, for example, a conductive metal such as copper (Cu).

The signal transmission line 520 is electrically connected to the driver chip 540. The signal transmission line 520 includes a first signal transmission line 520a and a second signal transmission line 520b, which are separated from each other by the driver chip 540. In other words, the first signal transmission line 520a electrically connects an output terminal of the driver chip 540 to the signal line 120 of the first substrate 500, and the second signal transmission line 520b electrically connects an input terminal of the driver chip 540 to the output terminal 410 of the PCB 400. The first and second signal transmission lines 520a and 520b may be straight, angled, and/or curved to fit on a limited surface area.

The protective layer 530 is disposed on the first surface of the base substrate to cover the signal transmission line 520. The protective layer 530 covers the signal transmission line 520 to protect the signal transmission line 520 from external impact. The protective layer 530 may cover less than all of the signal transmission line 520 so that the end portions of the signal transmission line 520 are exposed after deposition of the protective layer 530. The exposed end portions are electrically connected to either the output terminal 410 of the PCB 400 or the signal line 120 of the first substrate 500.

The driver chip 540 is formed on the base substrate 510 and electrically connected to the signal transmission line 520. Particularly, the driver chip 540 receives the control signal generated from the PCB 400 through the second signal transmission line 520b and converts the control signal into a driving signal. The driving signal is applied to the signal line 120 of the first substrate 100 through the first signal transmission line 520a. The driver chip 540 may be formed on a second surface of the base substrate 510 that is opposite to the first surface of the base substrate 510 on which the signal transmission line 520 is formed.

The crack-preventing portion 550 is formed on a portion of the second surface of the base substrate 510 to prevent a crack of the signal transmission line 520 from cracking. The crack-preventing portion 550 includes, for example, a metal such as a copper (Cu).

As described above, the flexible circuit film 500 is bent to place the PCB 400 under the first substrate 100. When the flexible circuit film 500 is bent, the signal transmission line 520 formed on the base substrate 510 is also bent, and this bending sometimes forms a crack in the signal transmission line 520. Thus, the crack-preventing portion 550 may be formed on the second surface of the base substrate 510 at the portion of the signal transmission line 520 that is the bent the most.

A crack in the signal transmission line 520 typically forms at the portions of the line that forms an angle when viewed from a plan view (hereinafter "angled portion"). Thus, the crack-preventing portion 550 may be formed at a position corresponding to the angled portion of the signal transmission line 520.

The flexible circuit film 500 may be formed as follows. The signal transmission line 520 is formed on the first surface of the base substrate 510 through deposition. Copper (Cu) is coated on substantially all of the second surface of the base substrate 510 and partially etched to form the crack-preventing portion 550 having a predetermined pattern. Thus, the crack-preventing portion 550 includes a copper pattern that is formed by etching a portion of a copper film formed on substantially the entire second surface of the base substrate 510.

The crack-preventing portion 550 includes a first crack-preventing portion 550a and a second crack-preventing portion 550b that are formed on parts of the second surface that correspond to edges of the protective layer 530 that is formed on the first surface. The edges of the protective layer 530 extend perpendicularly to the signal transmission line 520. The first crack-preventing portion 550a is formed near the side of the first substrate 100 that is connected to the flexible circuit film 500. The second crack-preventing portion 550b may be formed near the side of the PCB 400 that is connected to the flexible circuit film 500.

The first crack-preventing portion 550a may be formed on the part of the second surface that corresponds to a portion of the first surface that has an angled portion of the first signal transmission line 520a. Similarly, the second crack-preventing portion 550b may be formed on the part of the second surface that corresponds to a portion of the first surface that has an angled portion of the second signal transmission line 520b.

Referring again to FIGS. 2 and 4, the first signal transmission line 520a of the flexible circuit film 500 is electrically connected to the signal line 120 of the first substrate 100. Particularly, the protective layer 530 partially covers the first signal transmission line 520a to leave an end portion of the first signal transmission line 520a exposed. This exposed end portion couples to the first substrate 100. More specifically, the exposed end portion of the first signal transmission line 520a is electrically connected to the signal line 120 of the first substrate 100.

An overlapped length "N" between the flexible circuit film 500 and the first substrate 100 (see FIG. 3) is, for example, in the range of about 1.3 mm to about 1.4 mm, and may preferably be about 1.35 mm. For example, an anisotropic conductive film (ACF) 10 having a plurality of conductive balls 12 is interposed between the flexible circuit film 500 and the first substrate 100. The ACF 10 physically and electrically connects the flexible circuit film 500 and the first substrate 100 to each other. The end portion of the first signal transmission line 520a is electrically connected to the signal line 120 of the first substrate 100 through the conductive balls 12 of the ACF 10.

The flexible circuit film 500 and the first substrate 100 are connected to each other through the ACF 10, for example, using a tool bar 20. The tool bar 20 applies a predetermined pressure to the flexible circuit film 500 and the first substrate 100 under a relatively high temperature to connect the flexible circuit film 500 and the first substrate 100 to each other. The width of the tool bar 20 may be about 1 mm.

The first substrate 100 includes a transparent substrate 110 through which light may pass and the signal line 120 formed on the transparent substrate 110. The signal line 120 includes, for example, a data line (not shown) and a gate line (not shown). An inclined portion 112 is formed on an end portion of the transparent substrate 110. The width "M" of the inclined portion 112 (see FIG. 3) may be about 0.2 mm.

The first crack-preventing portion 550a is formed on a portion of the second surface of the base substrate 510 that is opposite to the portion of the first surface on which the first signal transmission line 520a is formed. As shown in FIG. 3, the first crack-preventing portion 550a extends from a position on the second substrate that corresponds to an end of the protective layer 530 toward the first substrate 100 by a first length L1. The first crack-preventing portion 550a overlaps the first protective layer 530 by a second length L2. For example, the first length L1 is in a range of about 0.05 mm to about 0.15 mm, and the second length L2 is in a range of about 0.8 mm to about 1.2 mm. The first and second lengths L1 and L2 may preferably be about 0.1 mm and about 1 mm, respectively. A distance "K" where the protective layer 530 extends over the first substrate 100 may be about 0.1 mm.

Referring again to FIGS. 4 and 5, when the flexible circuit film 500 connected to the first substrate 100 is bent to wrap around the edge of the first substrate 100, the PCB shown in FIG. 1 is disposed under the first substrate 100.

When the flexible circuit film 500 is bent to wrap around the edge of the first substrate 100, the first signal transmission line 520a is also bent. When the first signal transmission line 520a is bent by a large angle, a crack may form in the first signal transmission line 520a, especially at the angled portion of the first signal transmission line 520a.

The first crack-preventing portion 550a is formed corresponding to a bent portion of the first signal transmission line 520a so as to prevent crack formation. In other words, the first crack-preventing portion 550a is formed on a portion of the flexible circuit film 500 that is bent around an edge of the first substrate 100 for reinforcement. Since the part of the flexible circuit film 500 that bends around the edge of the first substrate 100 is especially vulnerable to cracking, strategic placement of the crack-preventing portion 550a effectively prevents crack formation in the first signal transmission line 520a.

The inclined portion 112 is formed along an edge of the transparent substrate 110 to remove a 90-degree corner of the transparent substrate 110, thereby preventing crack formation due to the angular portion of the transparent substrate 110.

Referring again to FIGS. 2 and 6, the second signal transmission line 520b of the flexible circuit film 500 is electrically connected to the output terminal 410 of the PCB 400. Particularly, the protective layer 530 partially covers the second signal transmission line 520b to leave the end portion of the second signal transmission line 520b corresponding to the PCB 400 exposed. The exposed end portion of the second signal transmission line 520b is electrically connected to the output terminal 410 of the PCB 400.

For example, an anisotropic conductive film (ACF) 10 having a plurality of conductive balls 12 are interposed between the flexible circuit film 500 and the PCB 400. The ACF 10 physically and electrically connects the flexible circuit film 500 and the PCB 400 to each other. The end portion of the second signal transmission line 520b is electrically connected to the output terminal 410 of the PCB 400 through the conductive balls 12 of the ACF 10.

The flexible circuit film 500 and the PCB 400 are connected to each other through the ACF 10, for example, using a tool bar 20. The tool bar 20 applies a predetermined pressure to the flexible circuit film 500 and the PCB 400 under a relatively high temperature to connect the flexible circuit film 500 and the PCB 400 to each other.

The second crack-preventing portion 550b is formed on a portion of the second surface of the base substrate 510, the second surface opposite to the first surface on which the second signal transmission line 520b is formed. As shown in FIG. 6, the second crack-preventing portion 550b extends from a position on the second surface that corresponds to an edge of the protective layer 530 toward the PCB 400 by a third length L3. The second crack-preventing portion 550b overlaps the protective layer 530 by a fourth length L4. In an exemplary embodiment, the third length L3 is in a range of about 0.05 mm to about 0.15 mm, and the fourth length L4 is in a range of about 0.8 mm to about 1.2 mm. The third and fourth lengths L3 and L4 may preferably be about 0.1 mm and about 1 mm, respectively. A distance "O" where the protective layer 530 extend over the PCB 400 may be about 0.1 mm.

The flexible circuit film 500 electrically connected to the PCB 400 may be bent to wrap around the edge of the PCB 400, and thus the second signal transmission line 520b of the flexible circuit film 500 is also bent. When the second signal transmission line 520b is bent by a large angle, a crack may form in the second signal transmission line 520b, especially at the angled portion of the second signal transmission line 520b.

The second crack-preventing portion 550b is formed on the portion of the flexible circuit film 500 a bent portion of the second signal transmission line 520b to prevent crack formation. In other words, the second crack-preventing portion 550b is formed on the end portion of the PCB 400 that is likely to be bent by a large angle to reinforce the second signal transmission line 520b, thereby preventing crack formation.

According to the present embodiment, the crack-preventing portion 550 is formed on a bent portion and an angled portion of the signal transmission line 520 to reinforce the signal transmission line 520, thereby preventing a crack from forming in the signal transmission line 520 when the signal transmission line 520 is bent.

The crack-preventing portion 550 includes the first and second crack-preventing portions 550a and 550b in FIGS. 1 to 6. Alternatively, the crack-preventing portion 550 may include just one of the first and second crack-preventing portions 550a and 550b.

Embodiment 2

Display Panel Assembly

A display panel assembly according to the present embodiment is substantially the same as the display panel assembly according to Embodiment 1 except for features in the crack-preventing portion. Thus, any further description of the similar parts will be omitted, and substantially the same elements will be represented by the same reference numerals and the same names.

Figure 7:
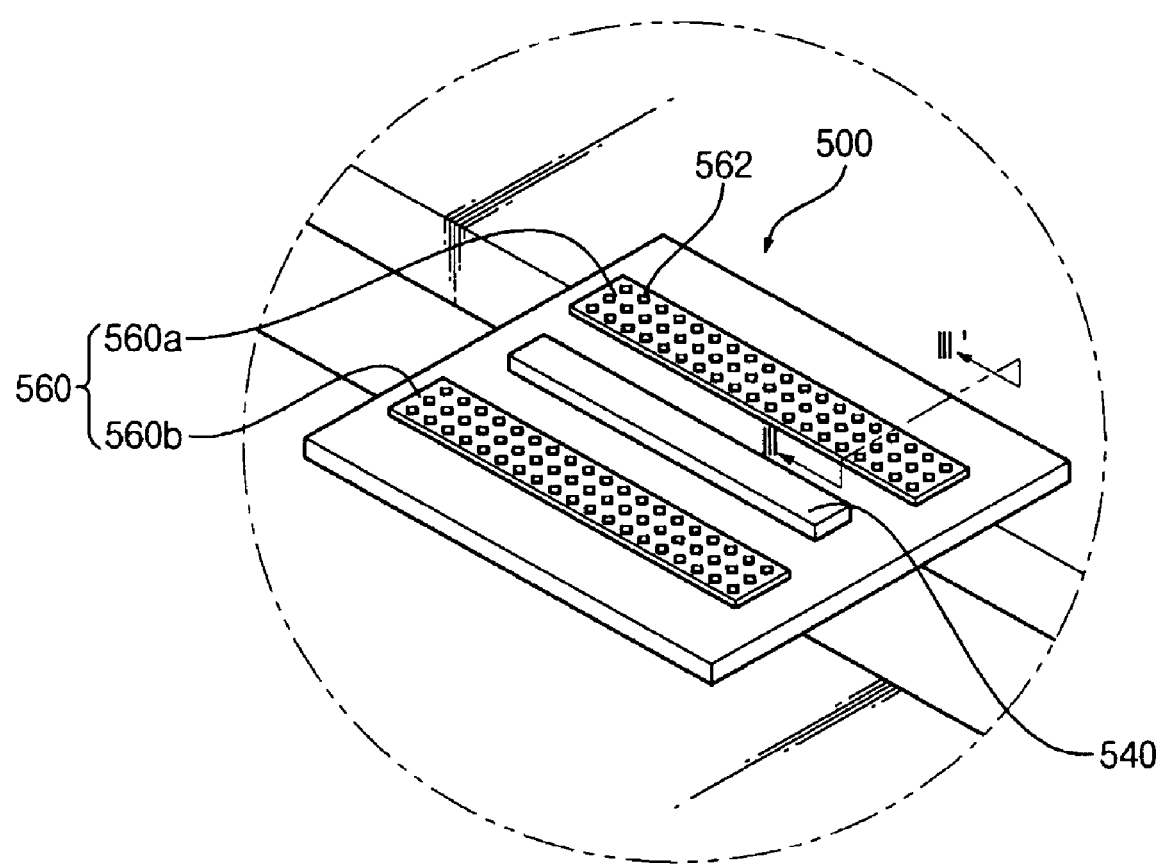
FIG. 7 is a perspective view illustrating a flexible circuit film of a display panel assembly according to a second embodiment of the present invention.
Figure 8:
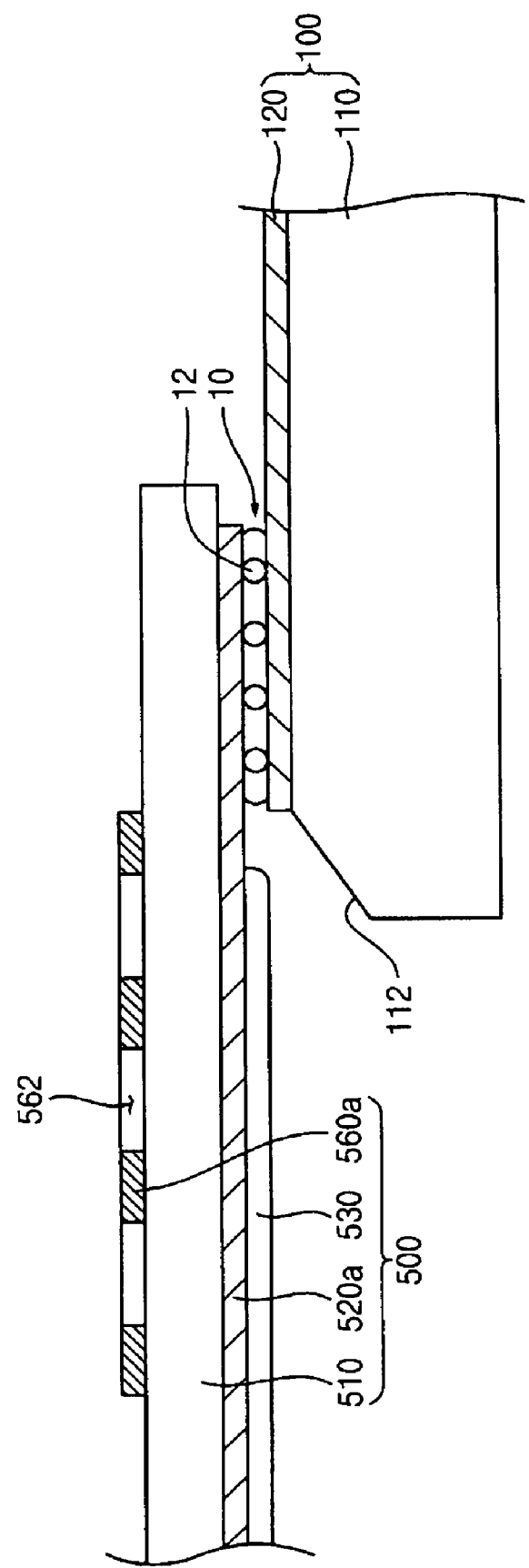
FIG. 8 is a cross-sectional view taken along the line III-III' in FIG. 7.

FIG. 7 is a perspective view illustrating a flexible circuit film of a display panel assembly according to a second example embodiment of the present invention. FIG. 8 is a cross-sectional view taken along the line III-III' in FIG. 7.

Referring to FIGS. 7 and 8, a flexible circuit film 500 according to the present invention includes the base substrate 510, the signal transmission line 520, the protective layer 530, the driver chip 540 and a crack-preventing portion 560.

The base substrate 510 may have the shape of a plate. The base substrate 510 may contain a ductile synthetic resin such as polyimide (PI).

The signal transmission line 520 is formed on a first surface of the base substrate 510 to electrically connect the PCB 400 to the first substrate 100. Particularly, the signal transmission line 520 is electrically connected to the output terminal 410 of the PCB 400 and electrically connected to the signal line 120 of the first substrate 500. The signal transmission line 520 may be laid out with a straight portion, an angled portion, and/or a curved portion to fit on a limited surface area.

The protective layer 530 is disposed on the first surface of the base substrate to cover the signal transmission line 520. The protective layer 530 covers the signal transmission line 520 to protect the signal transmission line 520 from external force or elements. The protective layer 530 may cover a portion of the signal transmission line 520 so that longitudinal end portions of the signal transmission line 520 may be open. The open end portions are electrically connected to the output terminal 410 of the PCB 400 or the signal line 120 of the first substrate 500.

The driver chip 540 is formed on the base substrate 510 and electrically connected to the signal transmission line 520. Particularly, the driver chip 540 receives the control signal generated from the PCB 400 through a part of the signal transmission line 520 and converts the control signal into a driving signal. The driving signal is applied to the signal line 120 of the first substrate 100 through another part of the signal transmission line 520.

The crack-preventing portion 560 is formed on a portion of a second surface of the base substrate 510 to prevent cracking of the signal transmission line 520. The crack-preventing portion 560 may contain, for example, a metal such as copper (Cu).

When the flexible circuit film 500 is bent to wrap around the first substrate 100, the signal transmission line 520 is also bent, and thus a crack may form in the signal transmission line 520. Thus, the crack-preventing portion 560 may be formed on the portion of the second surface of the base substrate 510 where the signal transmission line 520 is likely to be bent a lot during assembly. In addition, the crack-preventing portion 560 may be formed at a position on the second surface that corresponds to an angled portion of the signal transmission line 520 on the first surface.

The crack-preventing portion 560 includes, for example, a copper pattern that is formed by etching a portion of a copper film that is deposited on an entire portion of the second surface of the base substrate 510.

The crack-preventing portion 560 includes a first crack-preventing portion 560a and a second crack-preventing portion 560b that are formed on areas corresponding to edges of the protective layer 530, wherein the edges extend perpendicularly to the direction in which the signal transmission line 520 extends. The first crack-preventing portion 560a is formed over the edge of the first substrate 100 that is connected to the flexible circuit film 500. The second crack-preventing portion 560b is formed over the edge of the PCB 400 connected to the flexible circuit film 500.

A plurality of holes 562 is formed through the crack-preventing portion 560. Each of the holes 562 may have, for example, a quadrangular shape such as a rhombus shape. However, this is not a limitation of the invention and each of the holes 562 may have a triangular shape, circular shape, etc.

The crack-preventing portion 560 typically contains a metal material such as copper (Cu). Thus, the crack-preventing portion 560 has a coefficient of thermal expansion greater than that of other elements around it, including the base substrate 510. When the holes 562 are not formed through the crack-preventing portion 560, the crack-preventing portion 560 may expand more than the base substrate 510 due to externally transferred heat. When the crack-preventing portion 560 expands, thermal stress is generated in the flexible circuit film 500. As a result, the crack-preventing portion 560 may become detached and the flexible circuit film 500 may curve.

Thus, the holes 562 are formed through the crack-preventing portion 560 to provide a space to accommodate the expansion of the crack-preventing portion 560 when it receives heat. As a result, thermal stress of the flexible circuit film 500 is reduced.

According to the present invention, the crack-preventing portion is formed on a portion of the flexible circuit film 500 that corresponds to where the film 500 bends and where the signal transmission line is laid out to form an angle. By reinforcing these key areas, crack formation is prevented even in the places where the signal transmission line is bent by a large angle. Accordingly, defects in the signal transmission through the signal transmission line are decreased, improving the display quality of the display panel assembly.

In addition, the holes are formed through the crack-preventing portion to provide a space for accommodating any expansion of the crack-preventing portion by receiving externally transferred heat. As a result, thermal stress of the flexible circuit film may be prevented.

Although example embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A flexible circuit film comprising:
   a base substrate having a first surface and a second surface opposite the first surface;
   a driver chip formed on the base substrate;
   a first signal transmission line formed on the first surface of the base substrate, the first signal transmission line being electrically connected to an output terminal of the driver chip;
   a second signal transmission line formed on the first surface of the base substrate, the second signal transmission line being electrically connected to an input terminal of the driver chip;
   a first crack-preventing portion formed on the second surface of the base substrate and disposed corresponding to an angled portion of the first signal transmission line to prevent the angled portion of the first signal transmission line from cracking; and
   a second crack-preventing portion formed on the second surface of the base substrate and disposed corresponding to an angled portion of the second signal transmission line to prevent the angled portion of the second signal transmission line from cracking.

2. The flexible circuit film of claim 1, wherein at least one of the first crack-preventing portion and the second crack-preventing portion comprises copper, and wherein at least one of the first crack-preventing portion and the second crack-preventing portion has a plurality of holes formed therethrough.

3. The flexible circuit film of claim 1, further comprising a protective layer disposed on the first surface of the base substrate to cover at least a portion of the first signal transmission line and the second signal transmission line.

4. The flexible circuit film of claim 1, wherein the base substrate has a thickness of about 20 mm to about 30 mm.

5. The flexible circuit film of claim 3, wherein the protective layer partially covers the first and second signal transmission lines while leaving end portions of the first and second signal transmission lines exposed for connection.

6. The flexible circuit film of claim 5, wherein:
the first crack-preventing portion is formed on a part of the second surface that corresponds to a first edge of the protective layer on the first surface; and
the second crack-preventing portion is formed on a part of the second surface that corresponds to a second edge of the protective layer on the first surface.

7. The flexible circuit film of claim 6, wherein the first crack-preventing portion extends in a first direction and a second direction from the part of the second surface that corresponds to the first edge of the protective layer on the first surface by a first length and a second length, respectively, the first direction being opposite of the second direction.

8. The flexible circuit film of claim 7, wherein the first length is in a range of about 0.05 mm to about 0.15 mm, and the second length is in a range of about 0.8 mm to about 1.2 mm.

9. A display panel assembly comprising:
a display panel configured to display an image;
a printed circuit board configured to generate a control signal that displays the image; and
a flexible circuit film comprising:
a base substrate having a first surface and a second surface opposite the first surface;
a first signal transmission line formed on the first surface of the base substrate to be electrically connected to the display panel; and
a second signal transmission line formed on the first surface of the base substrate to be electrically connected to the printed circuit board;
a first crack-preventing portion formed on a portion of the second surface of the base substrate that is bent during assembly to prevent cracking of the first signal transmission line; and
a second crack-preventing portion formed on a portion of the second surface of the base substrate that is bent during assembly to prevent cracking of the second signal transmission line.

10. The display panel assembly of claim 9, wherein the first crack-preventing portion is formed on a part of the second surface that corresponds to an angled portion of the first signal transmission line on the first surface, and the second crack-preventing portion is formed on a part of the second surface that corresponds to an angled portion of the second signal transmission line on the first surface.

11. The display panel assembly of claim 9, wherein the display panel assembly comprises:
a first substrate electrically connected to the flexible circuit film, a thin film transistor being formed on the first substrate;
a second substrate positioned substantially parallel to the first substrate; and
a liquid crystal layer interposed between the first and second substrates.

12. The display panel assembly of claim 9, wherein the second crack-preventing portion is formed over an end portion of the printed circuit board that is electrically connected to the flexible circuit film.

13. The display panel assembly of claim 9, wherein at least one of the first crack-preventing portion and the second crack-preventing portion comprises a copper pattern having a plurality of holes formed therethrough.

14. The display panel assembly of claim 9, wherein the flexible circuit film further comprises a driver chip configured to convert the control signal into a driving signal that drives the display panel.

15. The display panel assembly of claim 9, further comprising at least one of a first anisotropic conductive film configured to electrically connect the flexible circuit film to the display panel and a second anisotropic conductive film configured to electrically connect the flexible circuit film to the printed circuit board.

16. The display panel assembly of claim 11, wherein the first crack-preventing portion is formed on a part of the second surface that is across from a part of the first surface that is electrically connected to the first substrate.

17. The display panel assembly of claim 12, further comprising a protective layer disposed on the first surface of the base substrate and partially covering the second signal transmission line to leave an end portion of the second signal transmission line exposed, the exposed end portion being on the edge of the flexible circuit film that is positioned closest to the printed circuit board,
wherein the second crack-preventing portion extends in a third direction and a fourth direction, from the part of the second surface that corresponds to an edge of the protective layer on the first surface that is closest to the printed circuit board, by a third length and a fourth length, respectively.

18. The display panel assembly of claim 16, wherein an inclined portion is formed on an end portion of the first substrate to eliminate a ninety-degree corner.

19. The display panel assembly of claim 16, further comprising a protective layer disposed on the first surface of the base substrate and partially covering the first signal transmission line while leaving an end portion of the first signal transmission line exposed,
wherein the first crack-preventing portion extends in a first direction and a second direction, from the part of the second surface that corresponds to an edge of the protective layer on the first surface that is closest to the first substrate, by a first length and a second length, respectively.

20. The display panel assembly of claim 16, wherein the flexible circuit film and the first substrate overlap for a distance in a range of about 1.3 mm to about 1.4 mm.

21. The display panel assembly of claim 17, wherein the third length is in a range of about 0.05 mm to about 0.15 mm, and the fourth length is in a range of about 0.8 mm to about 1.2 mm.

22. The display panel assembly of claim 19, wherein the first length is in a range of about 0.05 mm to about 0.15 mm, and the second length is in a range of about 0.8 mm to about 1.2 mm.

* * * * *